United States Patent

Kravitz

[15] 3,680,205

[45] Aug. 1, 1972

[54] METHOD OF PRODUCING AIR-ISOLATED INTEGRATED CIRCUITS

[72] Inventor: Bernard L. Kravitz, Queens, N.Y.

[73] Assignee: Dionics, Incorporated, Westbury, N.Y.

[22] Filed: March 3, 1970

[21] Appl. No.: 18,806

Related U.S. Application Data

[62] Division of Ser. No. 833,559, June 16, 1969, Pat. No. 3,559,283.

[52] U.S. Cl. ........................29/578, 156/17, 148/187

[51] Int. Cl. ................................................H011 7/50

[58] Field of Search ............156/17; 29/578; 148/187

[56] References Cited

UNITED STATES PATENTS

| | | | |
|---|---|---|---|
| 3,445,925 | 5/1969 | Lesk | 156/17 X |
| 3,531,857 | 10/1970 | Iwamatsu | 156/17 X |
| 2,994,121 | 8/1961 | Schockley | 156/17 X |

*Primary Examiner*—Jacob H. Steinberg
*Attorney*—Marn & Jangarathis

[57] ABSTRACT

Islands of dielectrically isolated monocrystalline silicon, fabricated in a polycrystalline base, are first produced. Device fabrication and beam lead interconnection follow. Thereafter the planar top surface is covered with an etch-resistant wax and the polycrystalline base is removed by etching. In another embodiment, $SiO_2$ is grown on a grooved, monocrystalline silicon slice, and polycrystalline silicon is deposited thereover. The slice is then lapped down on the top side so that the polycrystalline silicon and $SiO_2$ form barriers. Second side is lapped after devices are fabricated and after beam leads are formed. Active devices and beam leads are fabricated on one surface, and the polycrystalline material is lapped and etched away from the back. In either case, the remaining structure is an air-isolated beam lead device.

7 Claims, 21 Drawing Figures

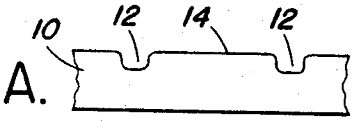
Fig. IA.
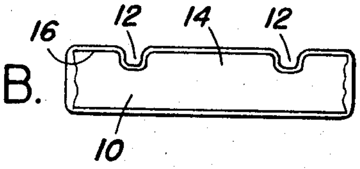
Fig. IB.
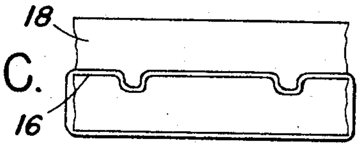
Fig. IC.
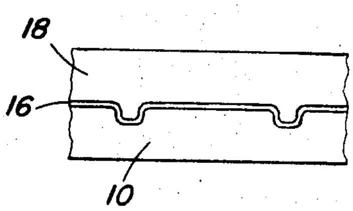
Fig. ID.
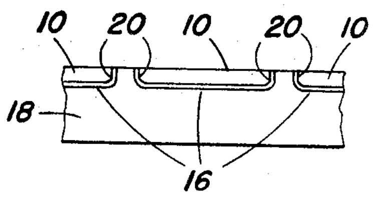
Fig. IE.
(Prior Art)
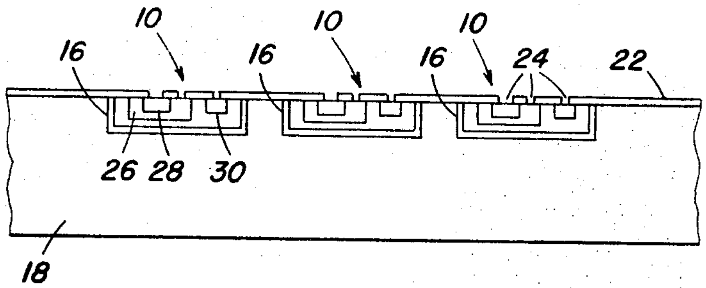
Fig. 2.
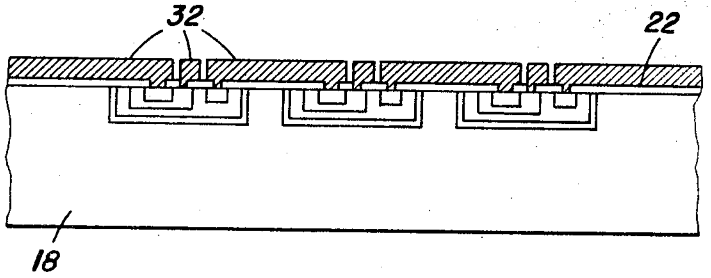
Fig. 3.
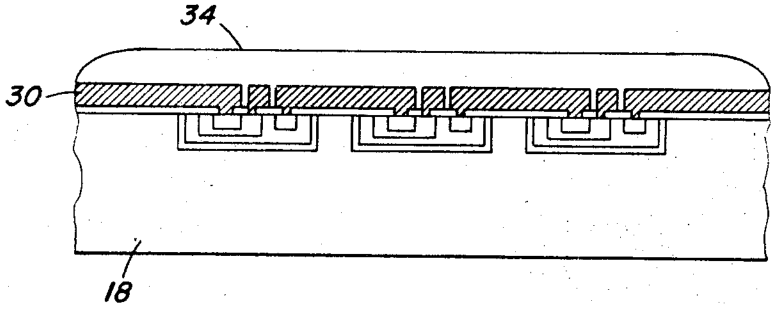
Fig. 4.
INVENTOR.
Bernard L. Kravitz INVENTOR.
Bernard L. Kravitz INVENTOR.
Bernard L. Kravitz

METHOD OF PRODUCING AIR-ISOLATED INTEGRATED CIRCUITS

RELATED APPLICATIONS

This application is a division of U.S. application Ser. No. 833,559 filed 16 June 1969, now U.S. Pat. No. 3,559,283, issued 2 Feb. 1971.

BACKGROUND OF THE INVENTION

1. Field of the Invention

This invention relates generally to beam lead integrated circuits and devices and, more particularly, it relates to a novel method of producing same wherein critical processing steps are carried out at the beginning of the process, thereby increasing the overall yield, particularly in the final processing steps.

2. Prior Art

The production of air-isolated beam lead devices, as heretofore practiced, may be summarized briefly as follows:

The starting material is a slice of monocrystalline semiconductor grade silicon, lapped and polished. A film of silicon dioxide is initially grown on the surface of the slice. A mask having selective openings is applied by photolithographic techniques and an etchant is used to remove the $SiO_2$ at the openings. Thereafter, dopants of various conductivity types are diffused into the silicon to form active and passive devices therein. A metal layer or layers is then applied over the entire surface and, by masking and etching procedures, the relatively thick beam lead structure is established. This generally involves a combination of titanium, platinum and gold. Lastly, the slice is turned over, and air-isolation channels are cut from the back side, and the slice is cut into discrete units.

It is important to note that the size of these devices is extremely small, leads may only be 0.5 mil, and the devices themselves may only be a few hundredths of an inch square. Thus, the cutting of air-isolation channels is an extremely critical step, and substantially any misalignment or other error can ruin a large number of devices. As the slice is, after device and lead fabrication, a high-cost item, low yields at this point have a large effect on costs.

Air-isolated devices are desirable because of the quality of isolation achieved, i.e., because air is such a good insulator. This kind of isolation is not always required, of course. In many monolithic devices, the isolation provided by two junctions around a body of material of the opposite conductivity type is sufficient. Another type of isolation is referred to as dielectric isolation.

To illustrate the production of dielectrically isolated devices, reference is made to FIGS. 1A-E of the drawings. The slice of silicon 10 is initially grooved 12 in such a manner that areas 14 where discrete devices are to be formed are defined thereby. An $SiO_2$ film 16 is then grown over the entire slice, FIG. 1B, and epitaxial, polycrystalline silicon 18 is deposited over the upper (grooved) surface, FIG. 1C. Thereafter, the composite block is lapped and polished (FIG. 1D), and the monocrystalline silicon is lapped down to a point where the grooves are intersected (FIG. 1E). The resulting structure comprises a base of polycrystalline silicon 18 having "cups" or "tubs" 20 in one surface, each "tub" being lined with dielectric $SiO_2$ 16; the "tubs" are filled with monocrystalline silicon "islands" 10, all that remains of the original slice. The device is completed in the conventional manner by growing $SiO_2$ over the surface of the island, masking and etching openings therein, forming active devices by diffusion, and applying passive devices and conductives by thin film metallizing techniques.

In the manufacture of dielectrically isolated devices the lapping down to produce the structure of FIG. 1E is critical, since a very slight misalignment can remove all of the "tubs" on a major portion of the slice.

OBJECTS OF THE INVENTION

An object of the present invention is to provide an improved method of fabrication air-isolated beam lead circuits and devices.

A further object of the invention is to provide a higher yield, lower cost method of fabricating air-isolated beam lead circuits and devices.

Various other objects and advantages of the invention will become clear from the following description of embodiments thereof, and the novel features will be particularly pointed out in connection with the appended claims.

THE DRAWINGS

In the accompanying drawings:

FIG. 1A–E illustrates, in sectional elevation, the steps employed by prior workers in preparing dielectrically isolated silicon single crystals;

FIGS. 2, 3, 4 and 5 illustrate, in sectional elevation, the steps employed in fabricating air-isolated beam lead devices, wherein the structure of FIG. 1E is employed as the starting material;

Figure 5:
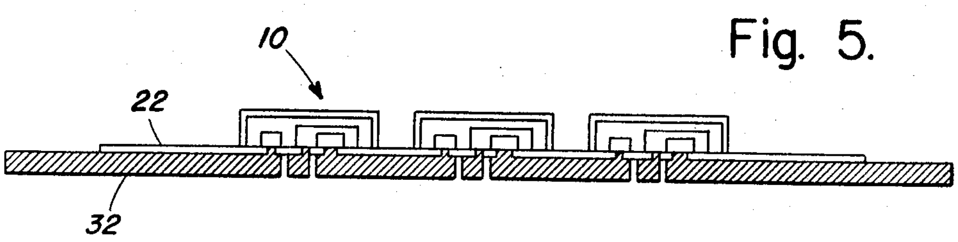

FIGS. 7A-K illustrate a second embodiment of the invention.

DESCRIPTION OF EMBODIMENTS

In carrying out the method of the invention, it is preferred to utilize as starting materials a dielectrically isolated slice of the type shown in FIG. 1E (in all of the figures, it will be understood that, for ease of illustration only a small portion of a slice is shown).

The first step is device fabrication, and is shown in FIG. 2. A planar oxide film 22 ($SiO_2$) is grown on the surface of the slice. Masking with a photoresist, exposing, developing, etching and mask removal result in openings 24 being formed in oxide film 22. Device fabrication follows. This can of course take many forms; as shown in FIG. 2, a *p*-type material 26 is diffused into the silicon to form a base, an *n*-type material 28 is then diffused to form an emitter, and an ohmic contact 30 is made to the n-type material to form a collector.

The next step of the process comprises fabricating the thick-film beam lead interconnections, and is shown in FIG. 3. Conventional procedures are employed in this step (plating, masking, etching, etc.) and they needn't be described in detail. The net result is that leads 32 are formed in a desired pattern on the upper surface of the base 18, connecting the various devices to each other and to terminations.

FIG. 4 illustrates the next step, which involves covering the exposed upper surface of the slice with a suitable etch resist 34, i.e., any acid-resistant wax. When the wax is in place, the entire device is immersed in a suitable etchant, such as an HF-$HNO_3$ mixture. Such an etchant will completely remove the polycrystalline silicon matrix. The $SiO_2$ lining 16 around the silicon 10, plus the oxide layer 22 on the surface, are essentially not attacked at all by the etchant, so there is an automatic stop-action to the etching step (more precisely the vast difference in the etch rates of polycrytalline silicon and $SiO_2$ provides a wide margin of safety).

Figure 6:
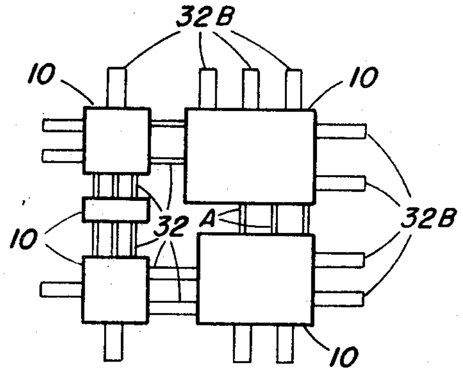
FIG. 6 is a plan view of a structure of the FIG. 5 type.

A finished, air-isolated device is shown in partial elevation in FIG. 5 and in plan in FIG. 6. The structure of FIG. 5 is merely that of FIG. 3 with polycrystalline silicon 18 removed, but inverted. As seen in FIG. 6, the completed device is seen to comprise a plurality of devices 10 air-conditioned from each other but connected to each other by leads 32A, and having terminations 32B for bonding to the corresponding land areas on the substrate or board to which it is to be attached.

In summary, by starting with dielectrically isolated material and fabricating a beam leaded circuit thereon, the air isolation can be achieved with a simple, non-critical, self-limiting etching of polycrystalline material, rather than a critical cutting of the single crystal material.

In the embodiment of FIG. 7, a modified procedure is used, but the same end product is produced. The starting material is a slice of monocrystalline silicon 36 having an oxide film 38 on at least one surface (FIG. 7A). Openings 40 are then formed in the film to define areas where isolation is ultimately desired (FIG. 7B), and an etchant is used to form grooves 42 at these areas (FIG. 7C). Additional oxide 44 is then grown in the grooves (FIG. 7D). Epitaxial polycrystalline silicon 46 is then deposited on the upper surface (FIG. 7E), and is then lapped off leaving the grooves filled with polycrystalline material 46 (FIG. 7F). The next step involves the forming of active devices 48 and the beam lead structure 50, following conventional procedures (FIG. 7G). The top surface of the slice is then waxed 52, a mounting plate 54 is affixed, and the bottom surface of the slice is lapped until the isolation grooves 42 are exposed (FIG. 7H). A photoresist 56 is then placed on the bottom surface and, with oxide 44 lining the grooves, the single crystal areas are completely protected (FIG. 7I).

At this point, two options are possible. The exposed polycrystalline material can be completely removed (FIG. 7J) and a conventional, air-isolated beam lead device produced (FIG. 6 and FIG. 7K). Alternatively, the polycrystalline material can be etched only at the periphery of the device, where "overhand" of the beam leads is necessary for the purpose of bonding the beam leads to a substrate, and the remainder of the polycrystalline material can be left intact, giving added mechanical strength to the finished device. In essence, this is a dielectric isolation device with a beam lead structure.

As noted hereinabove, the most critical steps in the production of air-isolated beam lead devices are the final ones, where grooves have to be produced on the underside of the device in precise alignment with the active devices and lead structure on the opposite side. Very elaborate optical devices, including infrared microscopes, have been used in this service, but low yield is still a problem. With the structure of FIG. 7H, on the other hand, the isolation pattern is clearly visible from the underside of the chip, and these problems are avoided. Further, with the oxide film in place the polycrystalline silicon may be etched readily without fear of lateral spread into the active device area. Lastly, the designer has the option of producing dielectric isolation or air isolation, depending on his needs.

Figure 7A:
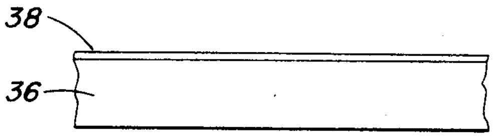
Figure 7B:
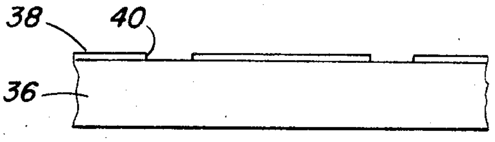
Figure 7C:
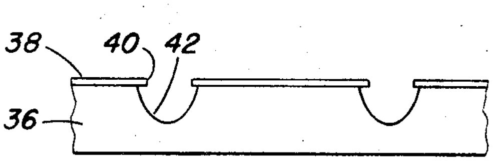
Figure 7D:
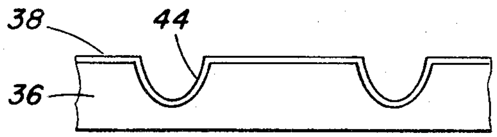
Figure 7E:
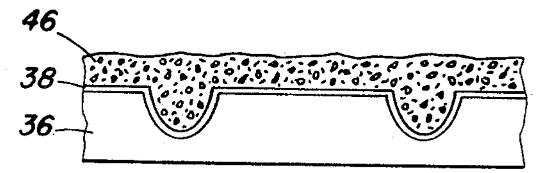
Figure 7F:
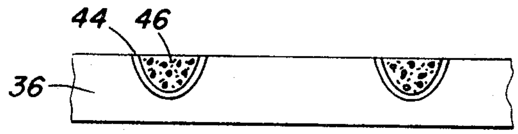
Figure 7G:
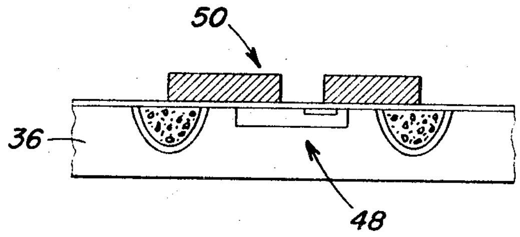
Figure 7H:
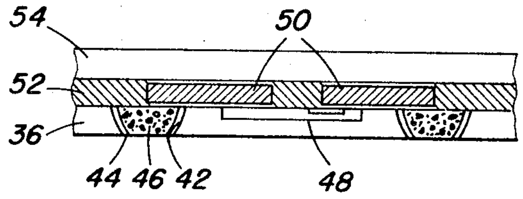
Figure 7I:
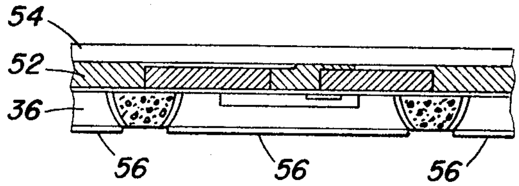
Figure 7J:
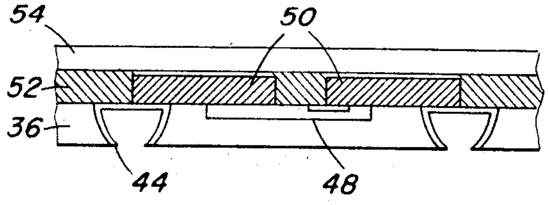
Figure 7K:
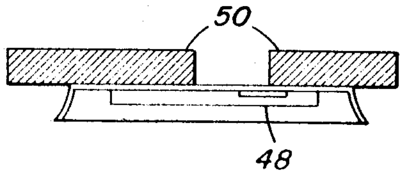

While the individual steps used in carrying out the invention should be generally familiar to those skilled in the art, it is believed that a better understanding of the invention will be obtained from the following detailed description thereof, wherein the starting material is a semi-fabricated device such as that shown in FIG. 3 or FIG. 7G.

1. Mounting — At completion of the metallurgy and electro-plating steps used to form the beam leads, the following mounting process is used. The slice is waxed down to a rigid, etch-resistant substrate such as teflon (TFE) or a teflon-coated substrate of glass, metal, ceramic or similar material. A wax such as Apiezon or Kel-F 200 (from 3M Co.) is melted onto the substrate by placing it on a simple laboratory hot plate. The slice is placed, face-down, into the puddle of wax so that the entire beam-lead surface is covered and the entire polycrystalline silicon surface is exposed. The substrate is removed from the hot plate and allowed to cool. When the substrate is cool and the etch-resistant wax is solidified, the etching process can start.
2. Etching — The etching solution is mixed in a teflon or polyethylene beaker, and is composed of 5 parts nitric acid, 3 parts acetic acid and 3 parts hydrofluoric acid, although other acid ratios are also effective. The chemicals are available from Baker & Adamson Chemical Co. and others. The substrate and slice are immersed in the etching solution until the polycrystalline silicon is etched away completely. The substrate and slice are then water-rinsed and immersed in dilute 10:1 Hydrofluoric Acid. This dissolves the oxide film which was used as the etch-barrier under the beam leads and around the single crystal active device areas. Further rinses in water are followed by methyl alcohol and the slice is dried using a jet of nitrogen gas. The structure can now be visually and/or electrically inspected.
3. Testing — A standard Bausch & Lomb 20X microscope or higher powered Nikon microscopes are used for visual inspection. For electrical inspection a Transistor Automation Corp. automatic probing machine can be used in conjunction with a Lorlin Industries electrical testing machine. Bad devices are automatically ink-marked by the TAC machine with an ink that is insoluble in trichloroethylene.
4. Dismounting — The slice and substrate are immersed in a clean Pyrex beaker filled with Reagent Grade trichloro-ethylene and the wax is dissolved. Eventually, all the wax is dissolved and the air-isolated beam-lead devices are free to collect in the bottom of the beaker. After several rinses, they are dried and are ready for assembly.

In the FIG. 7 embodiment, there will be two additional steps inserted after Mounting and before Etching. Here, it is necessary to mechanically lap the back of the slice using a Crane Lapmaster 12 Machine to expose the bottom of the grooves. The substrate can be manually or mechanically held down against the rotating surface of the lapping plate. The lapping slurry is automatically fed by the machine and can be a mixture of aluminum oxide and water or silicon carbide and water, using particle size of about 12 microns. Following the non-critical lapping-through of the pattern, i.e., the bottoms of polycrystalline filled grooves, the slice and substrate are thoroughly cleaned. Ultrasonic cleaning is done using a Branson Ultrasonic machine with water and alcohol as the cleaning agents. A nitrogen gas jet is used to blow the slice dry.

The slice and substrate are next placed on a Macronetics Corporation vacuum spinner. A film of Kodak Metal Etch Resist is spin-coated onto the freshly lapped face of the slice. After the film of Kodak KMER is oven dried to remove solvents, the slice and substrate are placed on a Kulicke and Soffa Corp. Model 686 Alignment machine. At this point, one must choose between an air-isolation beam-lead or dielectric isolation beam-lead construction.

If a standard air-isolation structure is desired, the photo-mask used during alignment and exposure must result in a KMER pattern which will mask only the single crystal active device areas and will expose for etching all the polycrystalline areas. If, however, a dielectric isolation beam-lead structure is desired, the photo-mask must result in a KMER pattern that masks all the single crystal active device areas and all the internal dielectric isolation between them, exposing for etching only the peripheral polycrystalline silicon under the beam leads used for attachment of the chip to a substrate.

In either case, once the mask is chosen, the process is identical. The mask pattern is exposed to ultra-violet light after correct alignment with the pattern of oxide lines produced by the earlier lapping through the bottom of the grooves. Using standard KMER Developer, the pattern is developed and the etch-resistant KMER is left only in areas where it is needed. The KMER is then baked and the slice is etched as described in Step 2 hereinabove.

The KMER pattern can be left on through all inspection and testing, and then removed with a suitable detergent or resist solvent or left to strip clean in the wax-dissolving step.

Various changes in the details, steps, materials and arrangements of parts, which have been herein described and illustrated in order to explain the nature of the invention, may be made by those skilled in the art within the principle and scope of the invention as defined in the appended claims and their equivalents. In particular, while single crystal silicon is the obviously preferred active material, other non-intrinsic semiconductors can be employed. Instead of $SiO_2$ as the dielectric, SiC and $Si_3N_4$ are obvious alternatives, and even other materials could be used. Also, instead of epitaxial polycrystalline silicon as the base material, any other material that can be deposited and etched as taught herein could be substituted.

What is claimed is:

1. A method for the manufacture of a beam lead semiconductive device from a slice of single crystal semiconductor material comprising:
   - forming grooves in one surface of said slice, said grooves defining areas where isolation is desired;
   - growing a continuous oxide film on said one surface and the surfaces of said grooves;
   - depositing polycrystalline material within said grooves;
   - forming active devices in said one surface by diffusion of material of preselected conductivity types through openings in said oxide film;
   - forming beam lead interconnections and terminations on said oxide layer and connecting with said active devices;
   - lapping the second surface of said slice until said grooves are exposed on said second surface;
   - masking said second surface of said slice with an etch-resistant material in a pattern adapted to cover at least said single crystal areas containing said active devices; and
   - removing the polycrystalline material from at least a portion of said grooves by etching.

2. The method as claimed in claim 1 wherein said slice is silicon, said oxide films are silicon dioxide and said polycrystalline material is epitaxial silicon.

3. The method as claimed in claim 1 wherein said deposition of polycrystalline material comprises (a) depositing said material over said entire one surface as well as said grooves, (b) lapping said one surface to remove all said polycrystalline material except that in said grooves and to expose said one surface, and (c) regrowing said oxide film on said one surface.

4. The process as claimed in claim 1, wherein, prior to said lapping step, said one surface is covered with an etchresistant material and is affixed to a mounting plate.

5. The process as claimed in claim 1, wherein said masking is patterned so that only polycrystalline material underlying beam lead terminations is removed in said etching step, thereby producing a beam lead dielectrically-isolated device.

6. The process as claimed in claim 1, wherein said masking is patterned so that all said polycrystalline material is removed in said etching step, thereby producing an air-isolated beam lead device.

7. The process as claimed in claim 1, wherein said groove forming step and said oxide growth step comprise:
   a. initially growing an oxide film on said one surface;
   b. forming openings in said oxide film over desired groove areas;
   c. etching said slice to form said grooves beneath said opening; and
   d. growing an oxide film on the surfaces of said grooves.

* * * * *

UNITED STATES PATENT OFFICE
CERTIFICATE OF CORRECTION

Patent No. 3,680,205 Dated August 1, 1972

Inventor(s) Bernard L. Kravitz

It is certified that error appears in the above-identified patent and that said Letters Patent are hereby corrected as shown below:

Column 2, line 16: "fabrication" should be --fabricating--.

Column 3, line 19: "air-conditioned" should be --air-isolated--; line 56: "overhand" should be --overhang--.

The following numerals should be printed in ordinary type rather than bold-faced type: column 4, line 25: "3"; line 43: "10:1"; line 52: "20"; column 5, line 4: "12", line 10: "12"; line 22: "686"; line 46: "2".

Signed and sealed this 9th day of January 1973.

(SEAL)
Attest:

EDWARD M.FLETCHER,JR.
Attesting Officer

ROBERT GOTTSCHALK
Commissioner of Patents